(12) United States Patent
Lee et al.

(10) Patent No.: US 8,008,708 B2
(45) Date of Patent: Aug. 30, 2011

(54) METAL LINE OF SEMICONDUCTOR DEVICE HAVING A DIFFUSION BARRIER AND METHOD FOR FORMING THE SAME

(75) Inventors: Nam Yeal Lee, Gyeonggi-do (KR);
Seung Jin Yeom, Gyeonggi-do (KR);
Baek Mann Kim, Gyeonggi-do (KR);
Dong Ha Jung, Gyeonggi-do (KR);
Joon Seok Oh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 83 days.

(21) Appl. No.: 12/486,124

(22) Filed: Jun. 17, 2009

(65) Prior Publication Data
US 2010/0052169 A1    Mar. 4, 2010

(30) Foreign Application Priority Data
Aug. 29, 2008    (KR) .................. 10-2008-0085392

(51) Int. Cl.
*H01L 29/788* (2006.01)
(52) U.S. Cl. ........................................ 257/316
(58) Field of Classification Search .................. None
See application file for complete search history.

(56) References Cited

U.S. PATENT DOCUMENTS

| | | | |
|---|---|---|---|
| 7,514,185 B2* | 4/2009 | Fukushima et al. | 430/5 |
| 2001/0014425 A1* | 8/2001 | Mitsui et al. | 430/5 |
| 2006/0024953 A1 | 2/2006 | Papa Rao et al. | |
| 2006/0270191 A1* | 11/2006 | Tamura et al. | 438/458 |
| 2007/0148814 A1* | 6/2007 | Pellizzer et al. | 438/102 |
| 2008/0132082 A1* | 6/2008 | Lopatin et al. | 438/765 |

FOREIGN PATENT DOCUMENTS
KR    10-0625816 B1    9/2006
* cited by examiner

*Primary Examiner* — Charles D Garber
*Assistant Examiner* — Andre' C Stevenson
(74) *Attorney, Agent, or Firm* — Ladas & Parry LLP

(57) ABSTRACT

An insulation layer is formed on a semiconductor substrate so as to define a metal line forming region. A diffusion barrier having a multi-layered structure of an $Mo_{x1}Si_{1-x1}$ layer, an $Mo_{x2}Si_{y2}N_{z2}$ layer, and an $Mo_{y3}N_{1-y3}$ layer is formed on a surface of the metal line forming region. A metal layer is formed on the diffusion barrier so as to fill the metal line forming region of the insulation layer.

20 Claims, 5 Drawing Sheets

METAL LINE OF SEMICONDUCTOR DEVICE HAVING A DIFFUSION BARRIER AND METHOD FOR FORMING THE SAME

CROSS-REFERENCE TO RELATED APPLICATIONS

The present application claims priority to Korean patent application number 10-2008-0085392 filed on Aug. 29, 2008, which is incorporated herein by reference in its entirety.

BACKGROUND OF THE INVENTION

The present invention relates generally to a metal line of a semiconductor device and a method for forming the same, and more particularly, to a metal line of a semiconductor device which can improve the characteristics of a diffusion barrier, thereby improving the characteristics and the reliability of a semiconductor device, and a method for forming the same.

Generally, in a semiconductor device, metal lines are formed to electrically connect elements or lines with each other. Contact plugs are formed to connect metal lines formed on different layers with each other, for example lower metal lines and upper metal lines. A current design trend is high integration of a semiconductor device, as a design rule decreases to conform to the high integration trend, the aspect ratio of a contact hole in which a contact plug is to be formed gradually increases. As a result, the difficulty and the importance of a process for forming the metal line and the contact plug have been noted.

Primarily, aluminum and tungsten are used as a material for the metal line of a semiconductor device since aluminum and tungsten have good electrical conductivity. Recently, research has been conducted for using copper as a next-generation material for a metal line because copper has excellent electrical conductivity and low resistance when compared to aluminum and tungsten. Copper (Cu) can therefore solve the problems associated with resistance-capacitance (RC) signal delay in the semiconductor device having a high level of integration and high operating speed.

When utilizing copper as the material for a metal line, unlike the case of using aluminum, the copper can diffuse to a semiconductor substrate through an insulation layer. The diffused copper acts as a deep-level impurity in the semiconductor substrate and induces a leakage current. Therefore, a diffusion barrier must be formed at an interface between a metal line of copper and the insulation layer. Generally, the diffusion barrier is made of TaN/Ta layers.

Hereinbelow, a conventional method for forming a metal line of a semiconductor device will be briefly described.

First, an insulation layer is formed on a semiconductor substrate so as to define a metal line forming region. Then, TaN/Ta layers serving as a diffusion barrier and a copper seed layer are sequentially formed on the surface of the insulation layer. Next, after forming a copper layer on the copper seed layer, a metal line is formed by removing the copper layer and the copper seed layer through a CMP (chemical mechanical polishing) process until the insulation layer is exposed.

However, in the conventional art described above, as the size of cells decreases, the thickness of the diffusion barrier also decreases. As a result, properly preventing the diffusion of a copper constituent by means of the diffusion barrier formed according to the conventional art is difficult.

Also, in the conventional art described above, increasing the thickness of the diffusion barrier to improve the characteristics of the diffusion barrier is also difficult due to the high integration trend. Due to this fact, as the characteristics of the diffusion barrier deteriorate, the characteristics and the reliability of a semiconductor device also deteriorate.

BRIEF SUMMARY OF THE INVENTION

Embodiments of the present invention include a metal line of a semiconductor device capable of improving the characteristics of a diffusion barrier and a method for forming the same.

Also, embodiments of the present invention include a metal line of a semiconductor device capable of improving the characteristics and the reliability of a semiconductor device and a method for forming the same.

In one aspect of the present invention, a metal line of a semiconductor device comprises an insulation layer formed on a semiconductor substrate and having a metal line forming region; a diffusion barrier formed on a surface of the metal line forming region of the insulation layer and having a multi-layered structure of an $Mo_{x1}Si_{1-x1}$ layer, an $Mo_{x2}Si_{y2}N_{z2}$ layer and an $Mo_{y3}N_{1-y3}$ layer; and a metal layer formed on the diffusion barrier to fill the metal line forming region of the insulation layer.

In the $Mo_{x1}Si_{1-x1}$ layer, x1 has a range of 0.2~0.7.

In the $Mo_{x2}Si_{y2}N_{z2}$ layer, x2 has a range of 0.1~0.4, y2 has a range of 0.1~0.4, and z2 has a range of 0.1~0.4.

In the $Mo_{y3}N_{1-y3}$ layer, y3 has a range of 0.3~0.6.

The $Mo_{x2}Si_{y2}N_{z2}$ layer has an amorphous phase.

The $Mo_{y3}N_{1-y3}$ layer has an amorphous phase.

The metal layer comprises a copper layer.

In another aspect of the present invention, a method for forming a metal line of a semiconductor device comprises the steps of forming an insulation layer on a semiconductor substrate to have a metal line forming region; forming a diffusion barrier on the insulation layer including a surface of the metal line forming region to have a multi-layered structure of an $Mo_{x1}Si_{1-x1}$ layer, an $Mo_{x2}Si_{y2}N_{z2}$ layer and an $Mo_{y3}N_{1-y3}$ layer; and forming a metal layer on the diffusion barrier to fill the metal line forming region.

The step of forming the diffusion barrier comprises the steps of forming an $Mo_{x1}Si_{1-x1}$ layer on the insulation layer including a surface of the metal line forming region; forming an $Mo_{y3}N_{1-y3}$ layer on the $Mo_{x1}Si_{1-x1}$ layer; and forming an $Mo_{x2}Si_{y2}N_{z2}$ layer between the $Mo_{x1}Si_{1-x1}$ layer and the $Mo_{y3}N_{1-y3}$ layer by annealing the semiconductor substrate formed with the $Mo_{y3}N_{1-y3}$ layer.

The step of forming the $Mo_{x1}Si_{1-x1}$ layer uses a gas including at least one of an $MoF_6$ gas and an $MOCl_5$ gas as a source gas for an Mo constituent.

The step of forming the $Mo_{x1}Si_{1-x1}$ layer uses a gas including at least one of an $SiH_4$ gas, an $SiH_2Cl_2$ gas, an $SiHCl_3$ gas and an $SiCl_4$ gas as a source gas for an Si constituent.

The step of forming the $Mo_{y3}N_{1-y3}$ layer comprises the steps of forming an Mo layer on the $Mo_{x1}Si_{1-x1}$ layer; and plasma-processing the Mo layer under a nitrogen atmosphere.

Plasma processing is conducted under an $N_2$ or $NH_3$ atmosphere.

The plasma processing is conducted under an atmosphere in which an $N_2$ constituent is contained by 10~60%.

The plasma processing is conducted at a temperature of 200~300° C.

The step of forming the Mo layer and the step of plasma-processing the Mo layer under the nitrogen atmosphere are simultaneously implemented.

Annealing is conducted under an $N_2$ or $NH_3$ atmosphere.

The annealing is conducted at a temperature in the range of 500~900° C.

The $Mo_{x1}Si_{1-x1}$ layer is formed such that x1 has a range of 0.2~0.7.

The $Mo_{x2}Si_{y2}N_{z2}$ layer is formed such that x2 has a range of 0.1~0.4, y2 has a range of 0.1~0.4, and z2 has a range of 0.1~0.4.

The $Mo_{y3}N_{1-y3}$ layer is formed such that y3 has a range of 0.3~0.6.

The $Mo_{x2}Si_{y2}N_{z2}$ layer is formed to have an amorphous phase.

The $Mo_{y3}N_{1-y3}$ layer is formed to have an amorphous phase.

after the step of forming the diffusion barrier and before the step of forming the metal layer, the method further comprises is the step of forming a seed layer on the diffusion barrier.

The metal layer comprises a copper layer.

BRIEF DESCRIPTION OF THE DRAWINGS

The above and other features and advantages of the present invention will become more apparent to those of ordinary skill in the art by describing in detail exemplary embodiments thereof with reference to the attached drawings, which are not necessarily to scale and in some instances proportions may have been exaggerated in order to more clearly depict certain features of the invention.

DESCRIPTION OF SPECIFIC EMBODIMENTS

In the present invention, when forming a metal line using a copper layer, a diffusion barrier is formed having the multi-layered structure of an $Mo_{x1}Si_{1-x1}$ layer, an $Mo_{x2}Si_{y2}N_{z2}$ layer, and an $Mo_{y3}N_{1-y3}$ layer. The $Mo_{x2}Si_{y2}N_{z2}$ layer and the $Mo_{y3}N_{1-y3}$ layer of the diffusion barrier are formed to have an amorphous phase, and therefore, the diffusion of a copper constituent is prevented and the characteristics of the diffusion barrier are improved. Accordingly, in the present invention, excellent diffusion barrier characteristics are secured without increasing the thickness of the diffusion barrier, and therefore, the present invention can be advantageously applied to the manufacture of a highly integrated semiconductor device.

Hereafter, specific embodiments of the present invention will be described in detail with reference to the attached drawings.

Figure 1:
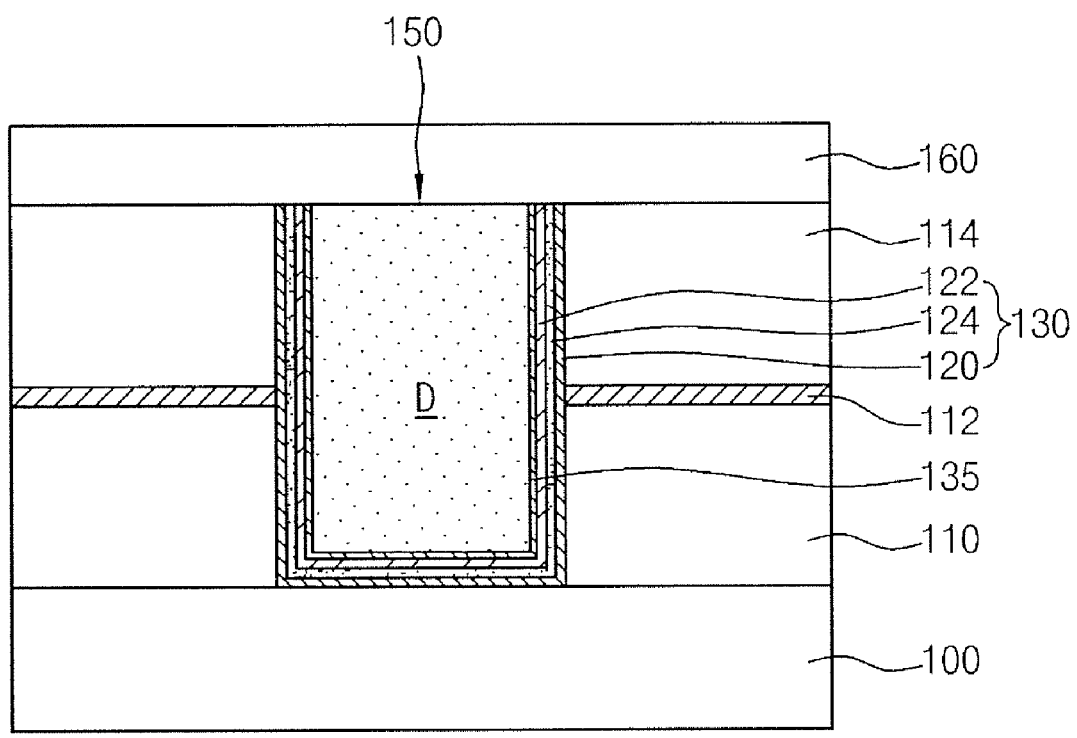
FIG. 1 is a cross-sectional view showing a metal line of a semiconductor device in accordance with an embodiment of the present invention.

FIG. 1 is a cross-sectional view showing a metal line of a semiconductor device in accordance with an embodiment of the present invention.

As shown in FIG. 1, a first insulation layer 110, an etch stop layer 112 and a second insulation layer 114 are formed on a semiconductor substrate 100 in such a way as to have a metal line forming region D. According to an embodiment of the present invention the semiconductor substrate is formed with a predetermined understructure (not shown). The metal line forming region D is defined for a single damascene process, or alternatively through a dual damascene process, to have a trench structure or alternatively, a trench and via-hole structure having a trench and at least one via-hole communicating with the trench. The first and second insulation layers 110 and 114 comprise, for example, silicon oxide layers, and the etch stop layer 112 comprises, for example, a silicon nitride layer.

A diffusion barrier 130 having a multi-layered structure of including an $Mo_{x1}Si_{1-x1}$ layer 120, an $Mo_{x2}Si_{y2}N_{z2}$ layer 124, and an $Mo_{y3}N_{1-y3}$ layer 122 is formed on the surfaces which define the metal line forming region D. In the $Mo_{x1}Si_{1-x1}$ layer 120, x1 has a range of 0.2~0.7. In the $Mo_{x2}Si_{y2}N_{z2}$ layer 124, x2 has a range of 0.1~0.4, y2 has a range of 0.1~0.4, and z2 has a range of 0.1~0.4. In the $Mo_{y3}N_{1-y3}$ layer 122, y3 has a range of 0.3~0.6. The $Mo_{x2}Si_{y2}N_{z2}$ layer 124 and the $Mo_{y3}N_{1-y3}$ layer 122 have an amorphous phase.

When compared to a conventional diffusion barrier, the $Mo_{x1}Si_{1-x1}$ layer 120 has superior junction capability with respect to the first and second insulation layers 110 and 114, excellent insulation characteristics, and characteristics for preventing the diffusion of a copper constituent. The $Mo_{x2}Si_{y2}N_{z2}$ layer of the present invention can effectively prevent the diffusion of the copper constituent, because the $Mo_{x2}Si_{y2}N_{z2}$ layer 124 has an amorphous phase. The $Mo_{y3}N_{1-y3}$ layer 122 is a very thermally stable compound and therefore prevents an Mo constituent from being solid-solved in the copper constituent. Also, since the $Mo_{y3}N_{1-y3}$ layer 122 has an amorphous phase, the $Mo_{y3}N_{1-y3}$ layer can effectively prevent the diffusion of the copper constituent.

Therefore, according to embodiments of the present invention, a diffusion barrier 130 having the multi-layered structure of the $Mo_{x1}Si_{1-x1}$ layer 120, the $Mo_{x2}Si_{y2}N_{z2}$ layer 124, and the $Mo_{y3}N_{1-y3}$ layer 122 sufficiently prevents the diffusion of the copper constituent even when the thickness of diffusion barrier 130 is small. Accordingly, in the present invention, the characteristics of the diffusion barrier 130 are improved without increasing the thickness thereof, and through this, the characteristics and the reliability of a semiconductor device can be improved.

A seed layer 135 is formed on the diffusion barrier 130, and a metal line 150 is formed on the seed layer 135 so as to fill the metal line forming region D. According to an embodiment of the present invention, the metal line 150 comprises a copper layer. A capping layer 160 is formed on the second insulation layer 114 and the metal line 150.

FIGS. 2A through 2G are cross-sectional views shown for illustrating the processes of a method for forming a metal line of a semiconductor device in accordance with another embodiment of the present invention.

Figure 2A:
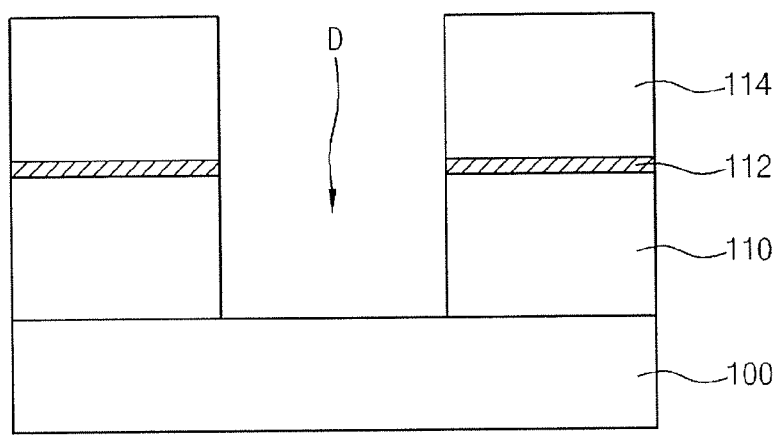
FIGS. 2A through 2G are cross-sectional views shown for illustrating the processes of a method for forming a metal line of a semiconductor device in accordance with another embodiment of the present invention.

Referring to FIG. 2A, a first insulation layer 110, an etch stop layer 112, and a second insulation layer 114 are sequentially formed on a semiconductor substrate 100, which is formed with a predetermined understructure (not shown), such that the understructure is covered. According to an embodiment of the present invention, the first and second insulation layers 110 and 114 comprise silicon oxide layers, and the etch stop layer 112 comprises a silicon nitride layer, although it should be understood that this is by way of example and the present invention is not limited in this way.

The second insulation layer 114, the etch stop layer 112, and the first insulation layer 110 are etched to define a metal line forming region D therein. The metal line forming region D is defined for a single damascene process, or alternatively a dual damascene process, to have a trench structure or a trench and via-hole structure having a trench and at least one via-hole communicating with the trench.

Figure 2B:
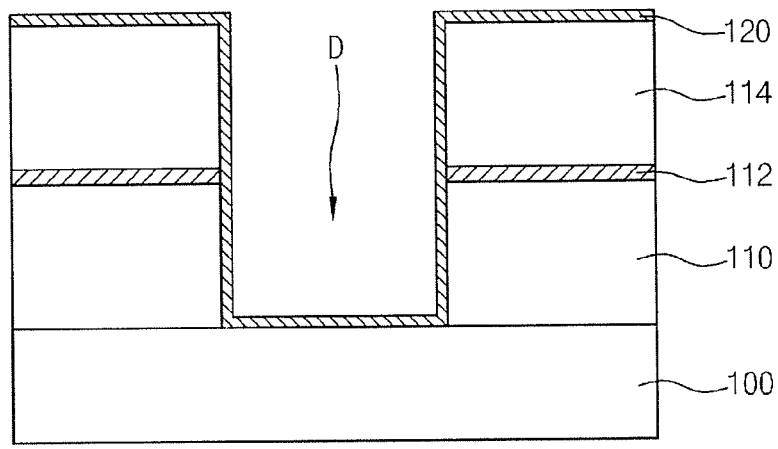

Referring to FIG. 2B, an $Mo_{x1}Si_{1-x1}$ layer 120 is formed on the second insulation layer 114 and the surfaces which define the metal line forming region D. The $Mo_{x1}Si_{1-x1}$ layer 120 is formed, preferably, through a plasma chemical vapor deposition (CVD) process. According to an embodiment of the present invention, the plasma CVD process utilizes a gas including at least one of an $MoF_6$ gas and an $MoCl_5$ gas as a source gas for an Mo constituent, and a gas including at least one of an $SiH_4$ gas, an $SiH_2Cl_2$ gas, an $SiHCl_3$ gas, and an $SiCl_4$ gas as a source gas for an Si constituent.

Figure 2C:
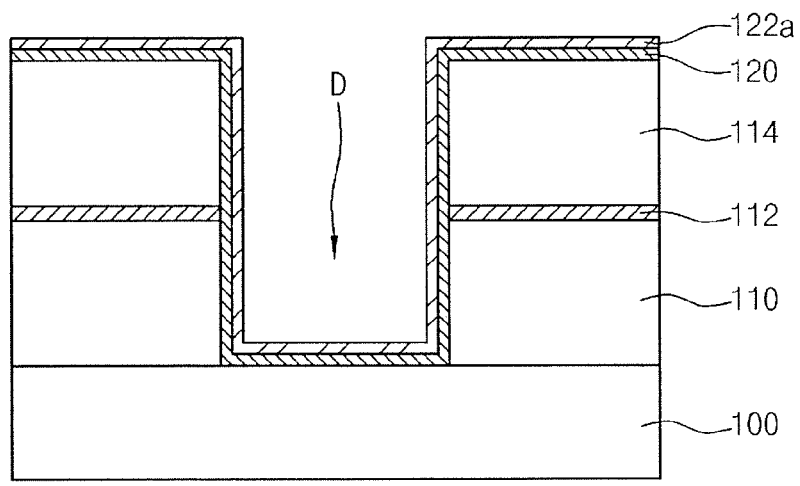

Referring to FIG. 2C, an Mo layer 122a is formed as a thin film on the $Mo_{x1}Si_{1-x1}$ layer 120. The Mo layer 122a is formed, for example, through one of a physical vapor deposition (PVD) process or a sputtering process.

Figure 2D:
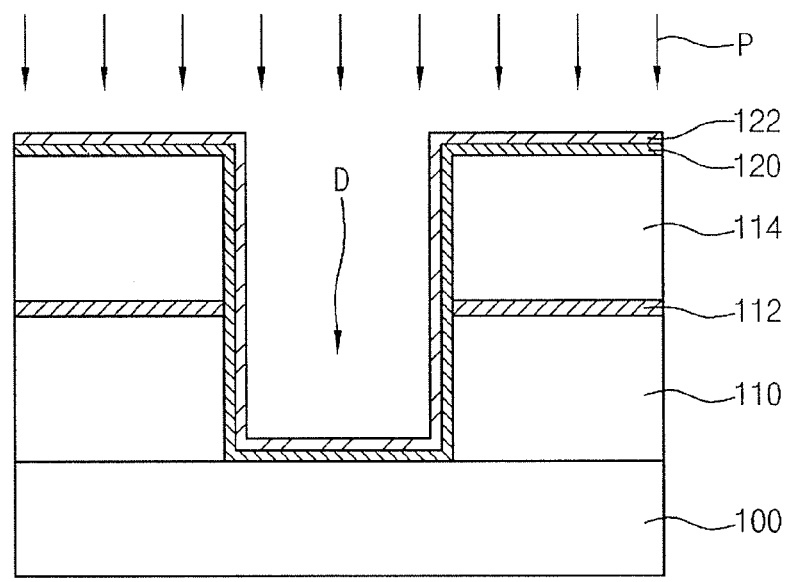

Referring to FIG. 2D, the Mo layer 122a is subjected to a plasma processing P under a nitrogen atmosphere, and through this an $Mo_{y3}N_{1-y3}$ layer 122 is formed on the $Mo_{x1}Si_{1-x1}$ layer 120. According to an embodiment of the present invention, the plasma processing P under the nitrogen atmosphere is conducted at a temperature in the range of 200~300° C. under an $N_2$ or $NH_3$ atmosphere. According to an embodiment of the present invention, the plasma processing P is conducted under an atmosphere in which an $N_2$ constituent is present in the range of 10~60%, preferably, at least 50%. Through this, the $Mo_{y3}N_{1-y3}$ layer 122 having an amorphous phase is formed.

Alternatively, although not shown, according to the present invention the $Mo_{y3}N_{1-y3}$ layer 122 can be formed by simultaneously conducting the plasma processing P under the nitrogen atmosphere when forming the Mo layer 122a.

Figure 2E:
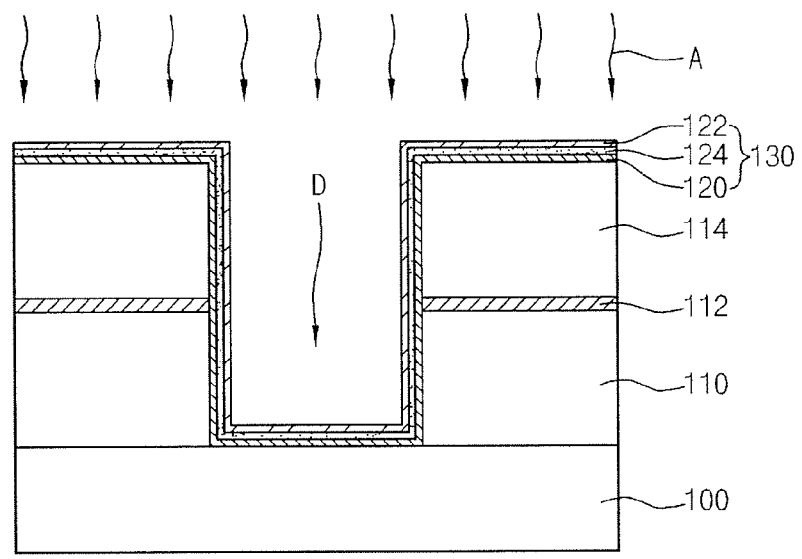

Referring to FIG. 2E, semiconductor substrate 100 having the $Mo_{y3}N_{1-y3}$ layer 122 and the $Mo_{x1}Si_{1-x1}$ layer 120 formed thereon is subjected to an annealing A so as to form an $Mo_{x2}Si_{y2}N_{z2}$ layer 124 between the $Mo_{x1}Si_{1-x1}$ layer 120 and the $Mo_{y3}N_{1-y3}$ layer 122. The annealing A is conducted such that the $Mo_{x1}Si_{1-x1}$ layer 120 and the $Mo_{y3}N_{1-y3}$ layer 122 react with each other. According to an embodiment of the present invention, the annealing A is conducted at a temperature in the range of 500~900° C., preferably, at least 600° C., under an $N_2$ or $NH_3$ atmosphere.

Accordingly, a diffusion barrier 130 having the multi-layered structure of the $Mo_{x1}Si_{1-x1}$ layer 120, the $Mo_{x2}Si_{y2}N_{z2}$ layer 124, and the $Mo_{y3}N_{1-y3}$ layer 122 is formed on the second insulation layer 114 and the surface of the metal line forming region D. According to an embodiment of the present invention, in the $Mo_{x1}Si_{1-x1}$ layer 120, x1 has a range of 0.2~0.7, and the $Mo_{x1}Si_{1-x1}$ layer 120 may comprise, for example, an $MoSi_2$ layer, an $Mo_5Si_3$ layer, or an $Mo_3Si$ layer. According to an embodiment of the present invention, in the $Mo_{x2}Si_{y2}N_{z2}$ layer 124, x2 has a range of 0.1~0.4, y2 has a range of 0.1~0.4, and z2 has a range of 0.1~0.4. According to an embodiment of the present invention, in the $Mo_{y3}N_{1-y3}$ layer 122, y3 has a range of 0.3~0.6, and the $Mo_{y3}N_{1-y3}$ layer 122 may comprise, for example, an $Mo_2N$ layer or an MoN layer. The $Mo_{x2}Si_{y2}N_{z2}$ layer 124 and the $Mo_{y3}N_{1-y3}$ layer 122 have an amorphous phase.

Figure 2F:
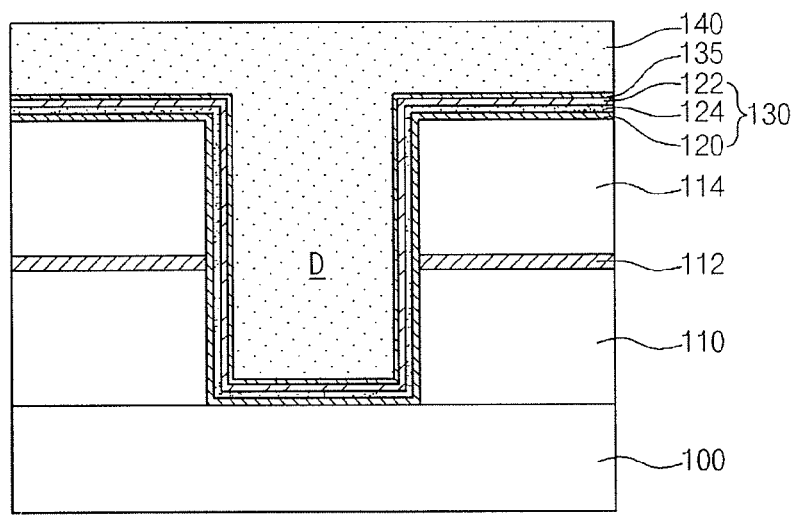

Referring to FIG. 2F, a seed layer 135 comprising, for example, a copper layer is formed on the diffusion barrier 130. Subsequently, a metal layer 140 is formed on the seed layer 135 so as to fill the metal line forming region D. According to an embodiment of the present invention, the metal layer 140 comprises a conductive layer, for example, a copper layer. The copper layer constituting the metal layer 140 is formed, preferably, through electroplating, although it should be understood that this is by way of example and the present invention is not limited in this way.

Figure 2G:
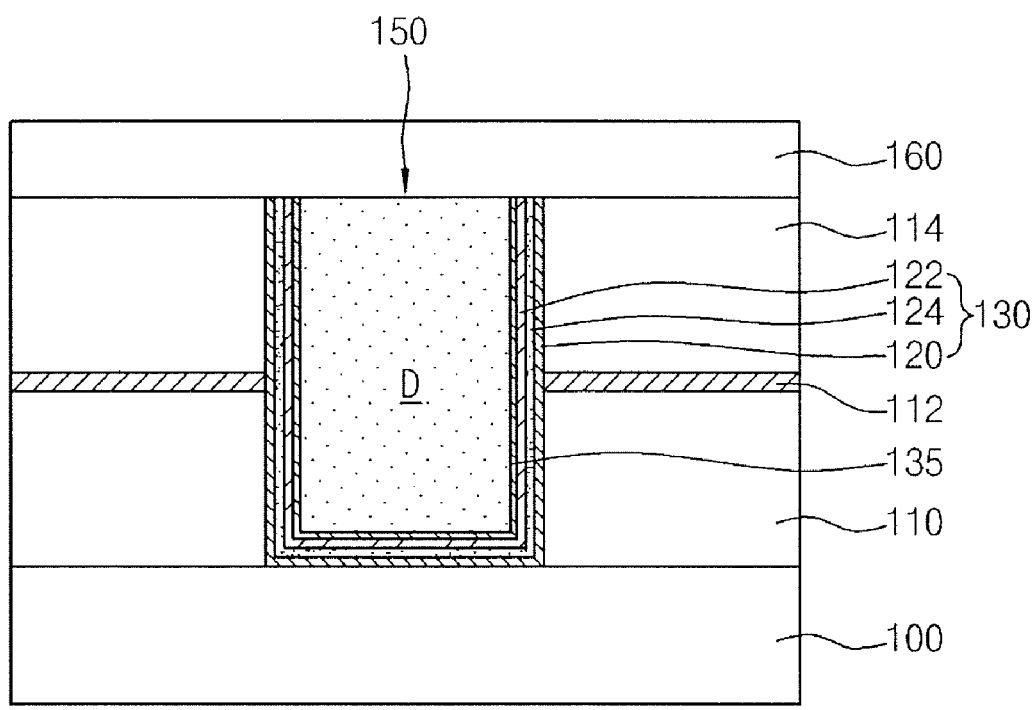

Referring to FIG. 2G, by chemically and mechanically polishing (CMPing) the metal layer 140, the seed layer 135 and the diffusion barrier 130 until the second insulation layer 114 is exposed, a metal line 150 filling the metal line forming region D is formed. A capping layer 160 is formed on the second insulation layer 114 including the metal line 150.

Thereafter, while not shown in detail, by sequentially conducting a series of well-known subsequent processes, the formation of the metal line of a semiconductor device according to an embodiment of the present invention is completed.

As is apparent from the above description, in the present invention, when forming a metal line using a copper layer, a diffusion barrier having the multi-layered structure of an $Mo_{x1}Si_{1-x1}$ layer, an $Mo_{x2}Si_{y2}N_{z2}$ layer, and an $Mo_{y3}N_{1-y3}$ layer is formed. When compared to a conventional barrier layer, the $Mo_{x1}Si_{1-x1}$ layer has superior junction capability with respect to first and second insulation layers, excellent insulation characteristics, and characteristics for preventing the diffusion of a copper constituent. Since the $Mo_{x2}Si_{y2}N_{z2}$ layer and the $Mo_{y3}N_{1-y3}$ layer have an amorphous phase, the $Mo_{x2}Si_{y2}N_{z2}$ layer and the $Mo_{y3}N_{1-y3}$ layer prevent the diffusion of the copper constituent. In particular, the $Mo_{y3}N_{1-y3}$ layer is a very thermally stable compound and therefore prevents an Mo constituent from being solid-solved in the copper constituent, whereby the diffusion of the copper constituent can be effectively prevented.

Accordingly, in the present invention, by forming the diffusion barrier having the multi-layered structure of the $Mo_{x1}Si_{1-x1}$ layer, the $Mo_{x2}Si_{y2}N_{z2}$ layer, and the $Mo_{y3}N_{1-y3}$ layer, the characteristics of the diffusion barrier are effectively improved, and through this, the characteristics and the reliability of a semiconductor device are improved. Also, in the present invention, because the diffusion of the copper constituent are prevented even without increasing the thickness of the diffusion barrier, the present invention can be advantageously applied to the manufacture of a highly integrated semiconductor device.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A metal line of a semiconductor device comprising an insulation layer formed on a semiconductor substrate defining a metal line forming region, the metal line comprising:
    a diffusion barrier formed on a surface of the metal line forming region of the insulation layer and having a multi-layered structure comprising an $Mo_{x1}Si_{1-x1}$ layer, an $Mo_{x2}Si_{y2}N_{z2}$ layer, and an $Mo_{y3}N_{1-y3}$ layer; and
    a metal layer formed on the diffusion barrier and filling the metal line forming region.

2. The metal line according to claim 1, wherein, in the $Mo_{x1}Si_{1-x1}$ layer, x1 has a range of 0.2~0.7.

3. The metal line according to claim 1, wherein, in the $Mo_{x2}Si_{y2}N_{z2}$ layer, x2 has a range of 0.1~0.4, y2 has a range of 0.1~0.4, and z2 has a range of 0.1~0.4.

4. The metal line according to claim 1, wherein, in the $Mo_{y3}N_{1-y3}$ layer, y3 has a range of 0.3~0.6.

5. The metal line according to claim 1, wherein the $Mo_{x2}Si_{y2}N_{z2}$ layer and the $Mo_{y3}N_{1-y3}$ layer have an amorphous phase.

6. The metal line according to claim 1, wherein the metal layer comprises a copper layer.

7. A method for forming a metal line of a semiconductor device, comprising:
    forming an insulation layer on a semiconductor substrate so as to define a metal line forming region;
    forming a diffusion barrier on the insulation layer and a surface defining the metal line forming region, the diffusion barrier to have a multi-layered structure comprising an $Mo_{x1}Si_{1-x1}$ layer, an $Mo_{x2}Si_{y2}N_{z2}$ layer, and an $Mo_{y3}N_{1-y3}$ layer; and
    forming a metal layer on the diffusion barrier so as to fill the metal line forming region.

8. The method according to claim 7, wherein forming the diffusion barrier comprises:
forming an $Mo_{x1}Si_{1-x1}$ layer on the insulation layer and a surface of the metal line forming region;
forming an $Mo_{y3}N_{1-y3}$ layer on the $Mo_{x1}Si_{1-x1}$ layer; and
annealing the semiconductor substrate having the $Mo_{y3}N_{1-y3}$ layer and the $Mo_{x1}Si_{1-x1}$ layer formed thereon so as to form an $Mo_{x2}Si_{y2}N_{z2}$ layer between the $Mo_{x1}Si_{1-x1}$ layer and the $Mo_{y3}N_{1-y3}$ layer.

9. The method according to claim 8, wherein forming the $Mo_{x1}Si_{1-x1}$ layer uses a gas comprising at least one of an $MoF_6$ gas and an $MoCl_5$ gas as a source gas for an Mo constituent, and a gas comprising at least one of an $SiH_4$ gas, an $SiH_2Cl_2$ gas, an $SiHCl_3$ gas, and an $SiCl_4$ gas as a source gas for an Si constituent.

10. The method according to claim 8, wherein forming the $Mo_{y3}N_{1-y3}$ layer comprises:
forming an Mo layer on the $Mo_{x1}Si_{1-x1}$ layer; and
plasma-processing the Mo layer under a nitrogen atmosphere.

11. The method according to claim 10, wherein the plasma processing is conducted under one of an $N_2$ and an $NH_3$ atmosphere.

12. The method according to claim 11, wherein the plasma processing is conducted at a temperature in the range of 200~300° C. under an atmosphere containing an $N_2$ of 10~60%.

13. The method according to claim 10, wherein the forming the Mo layer and the plasma-processing of the Mo layer under the nitrogen atmosphere implemented simultaneously.

14. The method according to claim 8, wherein the annealing is conducted at a temperature in the range of 500~900° C. under one of an $N_2$ and an $NH_3$ atmosphere.

15. The method according to claim 7, wherein the $Mo_{x1}Si_{1-x1}$ layer is formed such that x1 has a range of 0.2~0.7.

16. The method according to claim 7, wherein the $Mo_{x2}Si_{y2}N_{z2}$ layer is formed such that x2 has a range of 0.1~0.4, y2 has a range of 0.1~0.4, and z2 has a range of 0.1~0.4.

17. The method according to claim 7, wherein the $Mo_{y3}N_{1-y3}$ layer is formed such that y3 has a range of 0.3~0.6.

18. The method according to claim 7, wherein the $Mo_{x2}Si_{y2}N_{z2}$ layer and the $Mo_{y3}N_{1-y3}$ layer are formed to have an amorphous phase.

19. The method according to claim 7, further comprising:
after forming the diffusion barrier and before forming the metal layer, forming a seed layer on the diffusion barrier.

20. The method according to claim 7, wherein the metal layer comprises a copper layer.

* * * * *